United States Patent
Kim

(10) Patent No.: US 12,457,839 B2
(45) Date of Patent: Oct. 28, 2025

(54) ORGANIC PLANAR DIODE WITH CU ELECTRODE VIA MODIFICATION OF THE METAL SURFACE BY SAM OF FLUOROBIPHENYL BASED THIOL

(71) Applicant: University of Seoul Industry Cooperation Foundation, Seoul (KR)

(72) Inventor: Hyeok Kim, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 383 days.

(21) Appl. No.: 18/092,165

(22) Filed: Dec. 30, 2022

(65) Prior Publication Data

US 2023/0217664 A1    Jul. 6, 2023

(51) Int. Cl.
*H10K 10/23* (2023.01)
*H10K 71/60* (2023.01)
*H10K 85/60* (2023.01)

(52) U.S. Cl.
CPC ............. *H10K 10/23* (2023.02); *H10K 71/60* (2023.02); *H10K 85/60* (2023.02); *H10K 85/6576* (2023.02)

(58) Field of Classification Search
None
See application file for complete search history.

(56) References Cited

FOREIGN PATENT DOCUMENTS

| KR | 20130117557 A | 10/2013 |
| KR | 20190004940 A | 1/2019 |

OTHER PUBLICATIONS

H.-W. Chen, J.-H. Lee, B.-Y. Lin, S. Chen, S.-T. Wu, Liquid crystal display and organic light-emitting diode display: present status and future perspectives, Light Sci. Appl. 7 (2018) 17168.
J. Sheng, K.-L. Han, T. Hong, W.-H. Choi, J.-S. Park, Review of recent progresses on flexible oxide semiconductor thin film transistors based on atomic layer deposition processes, J. Semicond. 39 (2018), 011008.
S. Biswas, H. Kim, Solar Cells for Indoor Applications: Progress and Development, Polymers 12 (2020) 1338.
(Continued)

*Primary Examiner* — Anthony Ho
(74) *Attorney, Agent, or Firm* — NKL Law; Jae Youn Kim

(57) ABSTRACT

A surface of a copper (Cu) electrode is modified by a combination of preliminary oxidation treatment and grafting of a bifunctional self-assembled monolayer based on fluorobiphenylthiol (FBPS) or biphenylthiol (BPS). Under these conditions, a dinaphtho[2,3-b:2',3'-f]thieno[3,2-b]thiophene (DNTT)-based diode exhibits high mobility (0.35 $cm^2 \cdot V^{-1} \cdot s^{-1}$) due to the formation of an organized assembly of FBPS on copper oxide that has been partially reduced to $Cu_2O$. This organization controls that of a semiconductor film. On the other hand, the same treatment of a copper electrode with BPS molecules does not function due to the disorganization of both the BPS self-assembled monolayer (SAM) and the DNTT film. These results suggest that a monolayer of dipole-oriented molecules lowers an injection barrier and determines the semiconductor organization, thereby improving the performance of derived electronic parts.

5 Claims, 11 Drawing Sheets

(56) References Cited

OTHER PUBLICATIONS

S. Biswas, Y.-J. You, J. Kim, S.R. Ha, H. Choi, S.-H. Kwon, K.-K. Kim, J.W. Shim, H. Kim, Decent efficiency Improvement of organic photovoltaic cell with low acidic hole transport material by controlling doping concentration, Appl. Surf. Sci. 512 (2020), 145700.

R. Pode, Organic light emitting diode devices: An energy efficient solid state lighting for applications, Renew. Sustain. Energy Rev. 133 (2020), 110043.

Y. Wu, Y. Li, B.S. Ong, P. Liu, S. Gardner, B. Chiang, High-performance organic thin-film transistors with solution-printed gold contacts, Adv. Mater. 17 (2005) 184-187.

J.-P. Hong, A.-Y. Park, S. Lee, J. Kang, N. Shin, D.Y. Yoon, Tuning of Ag work functions by self-assembled monolayers of aromatic thiols for an efficient hole injection for solution processed triisopropylsilylethynyl pentacene organic thin film transistors, Appl. Phys. Lett. 92 (2008) 131.

N. Zhang, Y. Hu, X. Liu, Transparent organic thin film transistors with WO3/Ag/WO3 source-drain electrodes fabricated by thermal evaporation, Appl. Phys. Lett. 103 (2013) 120-121.

Campbell, S. Rubin, T. Zawodzinski, J. Kress, R. Martin, D. Smith, N. Barashkov, J. Ferraris, Controlling Schottky energy barriers in organic electronic devices using self-assembled monolayers, Physical Review B 54 (1996) R14321.

B. Choi, J. Rhee, H.H. Lee, Tailoring of self-assembled monolayer for polymer light-emitting diodes, Appl. Phys. Lett. 79 (2001) 2109-2111.

B. de Boer, A. Hadipour, M.M. Mandoc, T. van Woudenbergh, P.W. Blom, Tuning of metal work functions with self-assembled monolayers, Adv. Mater. 17 (2005) 621-625.

Y. Vaynzof, T.J. Dennes, J. Schwartz, A. Kahn, Enhancement of electron injection into a light-emitting polymer from an aluminum oxide cathode modified by a self-assembled monolayer, Appl. Phys. Lett. 93 (2008) 328.

H. Kim, Z. Meihui, N. Battaglini, P. Lang, G. Horowitz, Large enhancement of hole injection in pentacene by modification of gold with conjugated self-assembled monolayers, Org. Electron. 14 (2013) 2108-2113.

G. Heimel, L. Romaner, E. Zojer, J.-L. Br'edas, Toward control of the metal-organic interfacial electronic structure in molecular electronics: A first-principles study on self-assembled monolayers of Π-conjugated molecules on noble metals, Nano Lett. 7 (2007) 932-940.

S. Khodabakhsh, B.M. Sanderson, J. Nelson, T.S. Jones, Using Self-Assembling Dipole Molecules to Improve Charge Collection in Molecular Solar Cells, Adv. Funct. Mater. 16 (2006) 95-100.

Z. Jia, V.W. Lee, I. Kymissis, L. Floreano, A. Verdini, A. Cossaro, A. Morgante, In situ study of pentacene interaction with archetypal hybrid contacts: Fluorinated versus alkane thiols on gold, Physical Review B 82 (2010), 125457.

G. Kikugawa, T. Ohara, T. Kawaguchi, I. Kinefuchi, Y. Matsumoto, A molecular dynamics study on heat conduction characteristics inside the alkanethiolate SAM and alkane liquid, Int. J. Heat Mass Transf. 78 (2014) 630-635.

D.T. Valley, M. Onstott, S. Malyk, A.V. Benderskii, Steric hindrance of photoswitching in self-assembled monolayers of azobenzene and alkane thiols, Langmuir 29 (2013) 11623-11631.

P. Marmont, N. Battaglini, P. Lang, G. Horowitz, J. Hwang, A. Kahn, C. Amato, P. Calas, Improving charge injection in organic thin-film transistors with thiolbased self-assembled monolayers Organics, Electronics 9 (2008) 419.

M.S. Inkpen, Z.F. Liu, H. Li, L.M. Campos, J.B. Neaton, L. Venkataraman, Nonchemisorbed gold-sulfur binding prevails in self-assembled monolayers, Nat. Chem. 11 (2019) 351-358.

K. Hong, J.W. Lee, S.Y. Yang, K. Shin, H. Jeon, S.H. Kim, C. Yang, C.E. Park, Lower hole-injection barrier between pentacene and a 1-hexadecanethiol-modified gold substrate with a lowered work function, Org. Electron. 9 (2008) 21-29.

P. Lang, G. Horowitz, P. Valat, F. Garnier, J. Wittmann, B. Lotz, Spectroscopic evidence for a substrate dependent orientation of sexithiophene thin films deposited onto oriented PTFE, J. Phys. Chem. B 101 (1997) 8204-8211.

J.F. Kang, A. Ulman, S. Liao, R. Jordan, G. Yang, G.-Y. Liu, Self-assembled rigid monolayers of 4'-substituted-4-mercaptobiphenyls on gold and silver surfaces, Langmuir 17 (2001) 95-106.

G.J. Simpson, K.L. Rowlen, An SHG Magic Angle: Dependence of Second Harmonic Generation Orientation Measurements on the Width of the Orientation Distribution, J. Am. Chem. Soc. 121 (11) (1999) 2635-2636.

M.C. Biesinger, B.P. Payne, A.P. Grosvenor, L.W. Lau, A.R. Gerson, R.S.C. Smart, Resolving surface chemical states in XPS analysis of first row transition metals, oxides and hydroxides: Cr, Mn, Fe, Co and Ni, Applied Surface Science 257 (2011) 2717-2730.

M.C. Biesinger, Advanced analysis of Copper X-ray photoelectron spectra, Surf. Interface Anal. 49 (2017) 1325-1334.

J.Y. Zheng, T.K. Van, A.U. Pawar, C.W. Kim, Y.S. Kang, One-step transformation of Cu to Cu2O in alkaline solution, RSC Adv. 4 (36) (2014) 18616-18620.

J.L. Garcia Ruano, A. Parra, J. Aleman, Efficient synthesis of disulfides by air oxidation of thiols under sonication, Green Chem. 10 (2008) 706-711.

T. Yamamoto, K. Takimiya, Facile Synthesis of Highly Π-Extended Heteroarenes, Dinaphtho[2,3-b:2',3'-f] chalcogenopheno[3,2-b]chalcogenophenes, and Their Application to Field-Effect Transistors, J. Am. Chem. Soc. 129 (8) (2007) 2224-2225.

J. Geurst, Theory of space-charge-limited currents in thin semiconductor layers, physica status solidi, (b) 15 (1966) 107-118.

P. Knoll, R. Zuleeg, Space-charge-limited currents in heteroepitaxial films of silicon grown on sapphire, (1967).

ORGANIC PLANAR DIODE WITH CU ELECTRODE VIA MODIFICATION OF THE METAL SURFACE BY SAM OF FLUOROBIPHENYL BASED THIOL

CROSS-REFERENCE TO RELATED APPLICATION

This application claims priority to and the benefit of Korean Patent Application No. 10-2021-0194035, filed on Dec. 31, 2021, the disclosure of which is incorporated herein by reference in its entirety.

BACKGROUND

1. Field of the Invention

The present invention relates to an organic planar diode using a copper electrode. Specifically, the present invention relates to an organic planar diode with improved performance through surface modification of a copper electrode.

2. Discussion of Related Art

Demand for organic semiconductor-based electronic devices such as organic diodes, organic thin-film transistors, organic solar cells, organic light-emitting diodes, etc. is increasing day by day. Charge injection from a conducting electrode into a semiconductor active material plays an important role in the operation of these devices. Gold (Au) may be a perfect choice as an electrode material due to its excellent conductivity, high chemical stability, and optimal work function. However, the use of expensive gold for electrodes is not suitable for manufacturing low-cost electronic devices. In order to overcome such a limitation, recently, more attention is being paid to, easily available materials such as silver (Ag), copper (Cu), and aluminum (Al) that can significantly reduce manufacturing costs. The main drawbacks to such an approach are an energy barrier, which is caused by work function mismatch between a metal electrode and a semiconductor active layer, and metal oxidation. In order to reduce the energy barrier at an interface between the metal electrode and the semiconductor active layer, in 1996, Campbell et al. introduced an efficient technique. The Schottky energy barriers in organic electronic devices were tuned by grafting self-assembled monolayers (SAMs) on a surface of a metal electrode. Subsequently, many people adopted this technique to improve performance in various applications such as protective coatings, electronic devices, chemical sensors, etc. In 2007, Heimel et al. validated the interpretation of this technique by quantum mechanical simulations.

DOCUMENTS OF RELATED ART

Non-Patent Documents

[1] H.-W. Chen, J.-H. Lee, B.-Y. Lin, S. Chen, S.-T. Wu, Liquid crystal display and organic light-emitting diode display: present status and future perspectives, Light Sci. Appl. 7 (2018) 17168.
[2] J. Sheng, K.-L. Han, T. Hong, W.-H. Choi, J.-S. Park, Review of recent progresses on flexible oxide semiconductor thin film transistors based on atomic layer deposition processes, J. Semicond. 39 (2018), 011008.
[3] S. Biswas, H. Kim, Solar Cells for Indoor Applications: Progress and Development, Polymers 12 (2020) 1338.
[4] S. Biswas, Y.-J. You, J. Kim, S. R. Ha, H. Choi, S.-H. Kwon, K.-K. Kim, J. W. Shim, H. Kim, Decent efficiency improvement of organic photovoltaic cell with low acidic hole transport material by controlling doping concentration, Appl. Surf. Sci. 512 (2020), 145700.
[5] R. Pode, Organic light emitting diode devices: An energy efficient solid state lighting for applications, Renew. Sustain. Energy Rev. 133 (2020), 110043.
[6] Y. Wu, Y. Li, B. S. Ong, P. Liu, S. Gardner, B. Chiang, High-performance organic thin-film transistors with solution-printed gold contacts, Adv. Mater. 17 (2005) 184-187.
[7] J.-P. Hong, A.-Y. Park, S. Lee, J. Kang, N. Shin, D. Y. Yoon, Tuning of Ag work functions by self-assembled monolayers of aromatic thiols for an efficient hole injection for solution processed triisopropylsilylethynyl pentacene organic thin film transistors, Appl. Phys. Lett. 92 (2008) 131.
[8] N. Zhang, Y. Hu, X. Liu, Transparent organic thin film transistors with $WO_3/Ag/WO_3$ source-drain electrodes fabricated by thermal evaporation, Appl. Phys. Lett. 103 (2013) 120-121.
[9] I. Campbell, S. Rubin, T. Zawodzinski, J. Kress, R. Martin, D. Smith, N. Barashkov, J. Ferraris, Controlling Schottky energy barriers in organic electronic devices using self-assembled monolayers, Physical Review B 54 (1996) R14321.
[10] B. Choi, J. Rhee, H. H. Lee, Tailoring of self-assembled monolayer for polymer light-emitting diodes, Appl. Phys. Lett. 79 (2001) 2109-2111.
[11] B. de Boer, A. Hadipour, M. M. Mandoc, T. van Woudenbergh, P. W. Blom, Tuning of metal work functions with self-assembled monolayers, Adv. Mater. 17 (2005) 621-625.
[12] Y. Vaynzof, T. J. Dennes, J. Schwartz, A. Kahn, Enhancement of electron injection into a light-emitting polymer from an aluminum oxide cathode modified by a self-assembled monolayer, Appl. Phys. Lett. 93 (2008) 328.
[13] H. Kim, Z. Meihui, N. Battaglini, P. Lang, G. Horowitz, Large enhancement of hole injection in pentacene by modification of gold with conjugated self-assembled monolayers, Org. Electron. 14 (2013) 2108-2113.
[14] G. Heimel, L. Romaner, E. Zojer, J.-L. Br'edas, Toward control of the metal-organic interfacial electronic structure in molecular electronics: A first-principles study on self-assembled monolayers of n-conjugated molecules on noble metals, Nano Lett. 7 (2007) 932-940.
[15] S. Khodabakhsh, B. M. Sanderson, J. Nelson, T. S. Jones, Using Self-Assembling Dipole Molecules to Improve Charge Collection in Molecular Solar Cells, Adv. Funct. Mater. 16 (2006) 95-100.
[16] Z. Jia, V. W. Lee, I. Kymissis, L. Floreano, A. Verdini, A. Cossaro, A. Morgante, In situ study of pentacene interaction with archetypal hybrid contacts: Fluorinated versus alkane thiols on gold, Physical Review B 82 (2010), 125457.
[17] G. Kikugawa, T. Ohara, T. Kawaguchi, I. Kinefuchi, Y. Matsumoto, A molecular dynamics study on heat conduction characteristics inside the alkanethiolate SAM and alkane liquid, Int. J. Heat Mass Transf. 78 (2014) 630-635.
[18] D. T. Valley, M. Onstott, S. Malyk, A. V. Benderskii, Steric hindrance of photoswitching in self-assembled monolayers of azobenzene and alkane thiols, Langmuir 29 (2013) 11623-11631.

[19] P. Marmont, N. Battaglini, P. Lang, G. Horowitz, J. Hwang, A. Kahn, C. Amato, P. Calas, Improving charge injection in organic thin-film transistors with thiolbased self-assembled monolayers Organics, Electronics 9 (2008) 419.

[20] M. S. Inkpen, Z. F. Liu, H. Li, L. M. Campos, J. B. Neaton, L. Venkataraman, Nonchemisorbed gold-sulfur binding prevails in self-assembled monolayers, Nat. Chem. 11 (2019) 351-358.

[21] K. Hong, J. W. Lee, S. Y. Yang, K. Shin, H. Jeon, S. H. Kim, C. Yang, C. E. Park, Lower hole-injection barrier between pentacene and a 1-hexadecanethiol-modified gold substrate with a lowered work function, Org. Electron. 9 (2008) 21-29.

[22] P. Lang, G. Horowitz, P. Valat, E Garnier, J. Wittmann, B. Lotz, Spectroscopic evidence for a substrate dependent orientation of sexithiophene thin films deposited onto oriented PTFE, J. Phys. Chem. B 101 (1997) 8204-8211.

[23] J. F. Kang, A. Ulman, S. Liao, R. Jordan, G. Yang, G.-Y. Liu, Self-assembled rigid monolayers of 4'-substituted-4-mercaptobiphenyls on gold and silver surfaces, Langmuir 17 (2001) 95-106.

[24] G. J. Simpson, K. L. Rowlen, An SHG Magic Angle: Dependence of Second Harmonic Generation Orientation Measurements on the Width of the Orientation Distribution, J. Am. Chem. Soc. 121 (11) (1999) 2635-2636.

[25] M. C. Biesinger, B. P. Payne, A. P. Grosvenor, L. W. Lau, A. R. Gerson, R. S. C. Smart, Resolving surface chemical states in XPS analysis of first row transition metals, oxides and hydroxides: Cr, Mn, Fe, Co and Ni, Applied Surface Science 257 (2011) 2717-2730.

[26] M. C. Biesinger, Advanced analysis of Copper X-ray photoelectron spectra, Surf. Interface Anal. 49 (2017) 1325-1334.

[27] J. Y. Zheng, T. K. Van, A. U. Pawar, C. W. Kim, Y. S. Kang, One-step transformation of Cu to $Cu_2O$ in alkaline solution, RSC Adv. 4 (36) (2014) 18616-18620.

[28] J. L. Garcia Ruano, A. Parra, J. Aleman, Efficient synthesis of disulfides by air oxidation of thiols under sonication, Green Chem. 10 (2008) 706-711.

[29] T. Yamamoto, K. Takimiya, Facile Synthesis of Highly π-Extended Heteroarenes, Dinaphtho[2,3-b:2',3'-f]chalcogenopheno[3,2-b]chalcogenophenes, and Their Application to Field-Effect Transistors, J. Am. Chem. Soc. 129 (8) (2007) 2224-2225.

[30] J. Geurst, Theory of space-charge-limited currents in thin semiconductor layers, physica status solidi, (b) 15 (1966) 107-118.

[31] P. Knoll, R. Zuleeg, Space-charge-limited currents in heteroepitaxial films of silicon grown on sapphire, (1967).

SUMMARY OF THE INVENTION

The present invention is directed to providing a method of manufacturing an organic planar diode of which electrodes are formed of copper.

According to an aspect of the present invention, there is provided a method of performing preliminary oxidation on a copper electrode and a surface modification method using a self-assembled monolayer of fluorobiphenyl-based thiols.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1A:
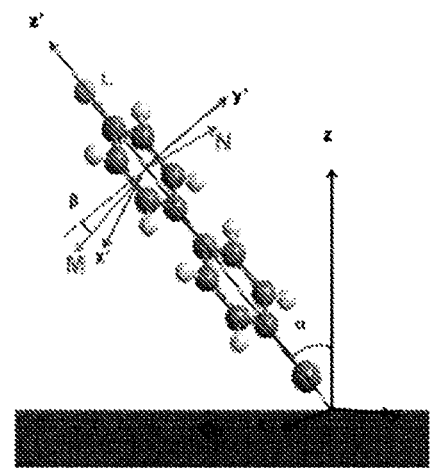
FIGS. 1(a) and 1(b) is a set of views showing the orientation of transition dipole moments of fluorobiphenylthiol (FBPS) and chemical structures of biphenylthiol (BPS) and (FBPS)
Figure 1B:
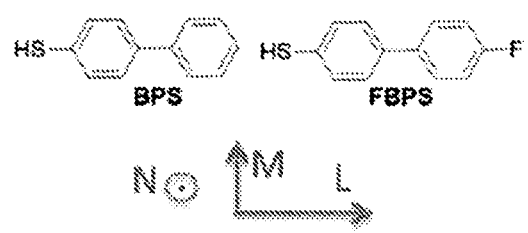

The terms used herein will be briefly described and embodiments of the present invention will be described in detail. Although the terms used herein are selected from among general terms that are currently and widely used in consideration of functions in embodiments of the present invention, these may be changed according to intentions of those skilled in the art, precedents, or the advent of new technology. In addition, in a specific case, some terms may be arbitrary selected by applicants. In this case, meanings thereof will be described in detail in a corresponding description of embodiments of the present invention. Therefore, the terms used herein should be defined based on meanings of the terms and content of this entire specification, rather than simply the terms themselves.

Hereinafter, embodiments of the present invention will be described in detail with reference to the accompanying drawings Demand for organic semiconductor (SC)-based electronic devices such as organic diodes, organic thin-film transistors, organic solar cells, organic light-emitting diodes, etc. is increasing day by day. Charge injection from a conducting electrode into an SC active material plays an important role in the operation of these devices. Gold (Au) may be a perfect choice as an electrode material due to its excellent conductivity, high chemical stability, and optimal work function. However, the use of expensive gold for electrodes is not suitable for manufacturing low-cost electronic devices. In order to overcome such a limitation, recently, more attention is being paid to, easily available materials such as silver (Ag), copper (Cu), and aluminum (Al) that can significantly reduce manufacturing costs. The main drawbacks to such an approach are an energy barrier, which is caused by work function mismatch between a metal electrode and an SC active layer, and metal oxidation. In order to reduce the energy barrier at an interface between the metal electrode and the SC active layer, in 1996, Campbell et al. introduced an efficient technique. The Schottky energy barriers in organic electronic devices were tuned by grafting self-assembled monolayers (SAMs) on a surface of a metal electrode. Subsequently, many people adopted this technique to improve performance in various applications such as protective coatings, electronic devices, chemical sensors, etc. In 2007, Heimel et al. validated the interpretation of this technique by quantum mechanical simulations.

An SAM is a two-dimensional (2D) assembly of ordered organic molecules that is grafted onto a surface of a substrate by adsorption of molecules with a specific affinity of their head-groups for the substrate. Generally, a thickness of an SAM is between 1 nm and 3 nm. The main advantage of using the SAM is that it can significantly tune the surface chemistry of a substrate. Moreover, a dipole formed by the SAM may have both positive and negative effects on the injection of charge in an SC. When an orientation of the dipole favors an appropriate charge transfer mechanism, the energy barrier for carriers at an interface between a metal and an SC will decrease. On the other hand, when the orientation of the dipole hinders charge transfer at the interface, the energy barrier will increase.

Depending on the nature of the SC, hole, or electron carrier, a work function (W) of an electrode should increase or decrease respectively to promote appropriate charge transfer. Therefore, selection or adjustment of molecules for SAM treatment of the electrode is a very important task. For example, recently, Kim et al. have observed that hole injection from an Au electrode into pentacene can be improved significantly by SAM treatment of Au with dipolar 4'-fluoro-1,1'-biphenyl-4-thiol (FBPS) and that, in the SAM, a fluorine atom is negatively charged and the dipole is directed toward the metal (−→+).

Meanwhile, the hole injection from the Au electrode into pentacene is hindered significantly by SAM treatment of an Au electrode by unsubstituted 1,1'-biphenyl-4-thiol (BPS), whose dipole is in an opposite orientation. The results were explained in terms of the adjustment of a height of an injection barrier by the interface dipole induced by the SAM. Initially, alkane-based molecules were used as SAMs to modify a surface of a metal electrode in an electronic devices due to their well-ordered 2D structures but, due to their insulating nature, it was necessary to compromise with the reduction in charge injection ability. In this regard, conjugated molecules with a phenyl moiety, such as thiophenols, perform better. Although Cu is an inexpensive and highly conductive metal, Cu has not been utilized as an electrode material in sophisticated electronic devices due to its low work function and environmental instability (oxidized in air).

Therefore, in the present invention, a surface of an inexpensive Cu electrode was modified by performing preliminary oxidation RCA and grafting a bifunctional SAM such as FBPS or BPS. A Cu electrode of a dinaphtho[2,3-b:2',3'-f]thieno[3,2-b]thiophene (DNTT)-based diode showed high mobility after performance of preliminary oxidation and grafting of a bifunctional SAM. The high mobility is caused by the formation of highly organized FBPS dipoles on a surface. On the other hand, the grafting of BPS on the Cu electrode subjected to oxidation in the same manner did not function well due to the organization of the BPS SAM on the surface of the electrode.

Experiments

BPS and FBPS (Fluorochem) (see FIG. 1(a)) were used without any further treatment. A thiol solvent was dichloromethane (Aldrich, HPLC grade) and was used after the treatment of sodium carbonate ($Na_2CO_3$) (0.5 M aqueous solution) and distillation under dinitrogen, stored under argon and shielded from light. In some cases, the solvent was carefully dried and stored on aluminum oxide ($Al_2O_3$) beads previously heated at 300° C. for one hour (called super dried or SD solvent). An ammonia ($NH_3$) solution (25% aqueous solution) and hydrogen peroxide ($H_2O_2$, 25% aqueous solution) were obtained from Aldrich.

DNTT was purchased from Aldrich and used as is. Copper was deposited on glass under vacuum. Gold films on glass substrates were purchased from Arrandee Metal GmbH+Co. KG.

In order to control the reproducibility and stability of an SAM/Cu system, a Cu/glass substrate was oxidized with a $NH_3/H_2O_2/H_2O$ solution (hereinafter, referred to as "RCA cleaning") having a ratio (v/v/v) of 1/1/400 to 1/1/32000 at 80° C. for two minutes. Preferably, ratios of 1/1/4000 and 1/1/16000 may be used. BPS and FBPS solutions ($10^{-3}$ M) were prepared in dichloromethane ($CH_2Cl_2$) or SD solvent. After the RCA cleaning was performed, the Cu substrate was rinsed with ultra-pure water (18 MΩ·cm, ELGA), then immersed in $CH_2Cl_2$, and finally placed in a thiol solution immediately to avoid any contamination. The immersion time was one hour. Thereafter, the Cu substrate was rinsed thoroughly (two times for two minutes) with $CH_2CH_2Cl_2$ twice, dried, and stored in argon. An Au slide was immersed 30 times (two seconds each immersion) in a water-ethanol (50/50 vol %) mixture in an ultrasonic bath. Then, passed rapidly three to six times through a hydrogen flame for about 0.5 seconds, cooled under argon, immersed in water and $CH_2Cl_2$, and immediately immersed in the thiol solution.

Conventionally, it has been observed that the orientation of dipole molecules in a SAM is a very important factor for SAM-treated metal electrodes. The orientation of the dipole molecules in the SAM may affect charge carrier injection from an electrode into an SC layer. SAMs are generally oriented at an angle α with respect to the normal (see FIG. 1(a)) in order to optimize Van der Waals interactions. Such an angle varies depending on the nature of the interfacial bond, the hybridization of the graft atomic orbital, the chain length, and the substrate. The orientation of dipole molecules of SAMs formed on a particular surface may be evaluated using polarized modulated-infrared reflection absorption spectroscopy (PM-IRRAS) spectra and infrared (IR) spectra of isotopically dispersed molecules in a KBr pellet.

An orientation of the transition dipole moment Mi for a vibration i was taken from the related art ([13],[23]). When a selection rule is applied to a metal substrate, a PM-IRRAS signal may be expressed by Equation 1 below.

$$I(M_i) = k \cdot (M_i \cdot E)^2 = k \cdot M_i^2 E^2 \cos^2(M_i, E) = k \cdot M_i^2 E^2 F_i(\alpha, \beta) \quad \text{[Equation 1]}$$

Here, E denotes an electric field at the surface, α denotes a tilt angle, β denotes a twist angle, and k is a constant. The angles may be expressed by Equation 2 below.

$$\beta = \arctan\sqrt{\frac{I_N A_M}{I_M A_N}}, \alpha = \arctan\sqrt{\frac{I_M A_L}{I_L A_M \cos^2\beta}} \quad \text{[Equation 2]}$$

Here, $I_N$, $I_M$, and $I_L$ denote areas under the curve of the PM-IRRAS spectrum associated with peaks at 815 cm$^{-1}$ (N), 1,601 cm$^{-1}$ (M), and 1,517 cm$^{-1}$ (L) for FBPS and 825 cm$^{-1}$ (N), 1,086 cm$^{-1}$ (M), and 1,475 cm$^{-1}$ (L) for BPS. $A_N$, $A_M$, and $A_L$ denote areas under absorbance spectra of the molecules dispersed in a KBr pellet.

Figure 2:
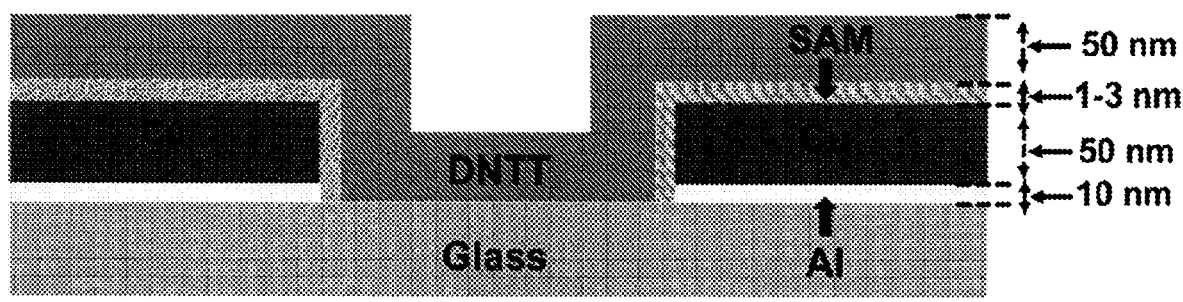
FIG. 2 is a cross-sectional view of a dinaphtho[2,3-b:2', 3'-f]thieno[3,2-b]thiophene (DNTT)-based organic planar diode according to the present invention.

In order to determine an effect of SAM treatment on the performance of Cu as an electrode in an electronic device, planar diodes (see schematic view in FIG. 2) having differently treated Cu electrodes (on which preliminary oxidation and grafting of a bifunctional SAM based on FBPS or BPS were performed) and having DNTT as an active material were manufactured.

This type of diode structure is generally used in various electronic devices such as organic photovoltaic (OPV) devices, organic field-effect transistors (OFETs), organic light-emitting diodes (OLEDs), etc. A 10 nm-thick Al layer was deposited on a glass substrate using a shadow mask. An Al adhesion layer was used to improve the adhesion of copper and to prevent degradation of the copper during subsequent chemical treatment. Thereafter, two 1 mm-long and 50 nm-thick Cu electrodes were formed by depositing Cu using the same mask by vacuum deposition (10$^{-4}$ Pa). A distance between the two electrodes was fixed at 30 μm. Thereafter, the Cu electrodes were treated in different ways and a 50 nm-thick SC layer (DNTT) was deposited at 10$^{-5}$ Pa.

Static contact angles of different SAMs with water were measured in water-saturated air by a Digidrop (GBX, France) contact angle measurement system. PM-IRRAS measurements of various samples were performed on an argon-purged Nicolet 860 FTIR spectrometer with IR beams at a grazing angle of 85°. X-ray photoelectron spectroscopy (XPS) signals were recorded using a Thermo VG ESCALAB 250 system equipped with a monochromatic Al Kα X-ray source (1486:6 eV), 400 μm-sized X-ray beams, and a magnetic lens that increases an electron acceptance angle to improve sensitivity. Spectra were acquired in a constant analyzer energy mode, with pass energies of 100 and 40 eV for an irradiation region and a narrow region, respectively. Positions of peak binding energy were calibrated by setting an aromatic C1 of SAMs at 284.2 eV or a contamination carbon C1 at 285 eV in absence of SAMs.

X-ray diffraction profiles of DNTT films on treated Cu surfaces were recorded in air on a Rigaku Ultima IV diffractometer with a Cu Kα source (λ=1.54187 Å). Current (I)-voltage (V) curves of diodes were recorded on a Keithley 4200 semiconductor system.

Results

First, contact angles of SAMs with ultra-pure water were measured. These measurements indicate that both BPS and FBPS SAM-grafted oxidized copper substrates are hydrophobic. This corresponds to a low surface free energy, which is compatible with the hydrophobic nature of the terminal groups of these SAMs. The contact angles were measured to be 1090 for a BPS SAM and 95.7° for an FBPS SAM. These high angles indicate that layers are dense. In order to measure the orientation of the SAMs with respect to the Cu substrate normal, the PM-IRRAS spectra were recorded.

PM-IRRAS spectra of SAMs grafted onto Cu were examined under various conditions.

Influence of RCA Cleaning Performed on Copper Substrate

Figure 3:
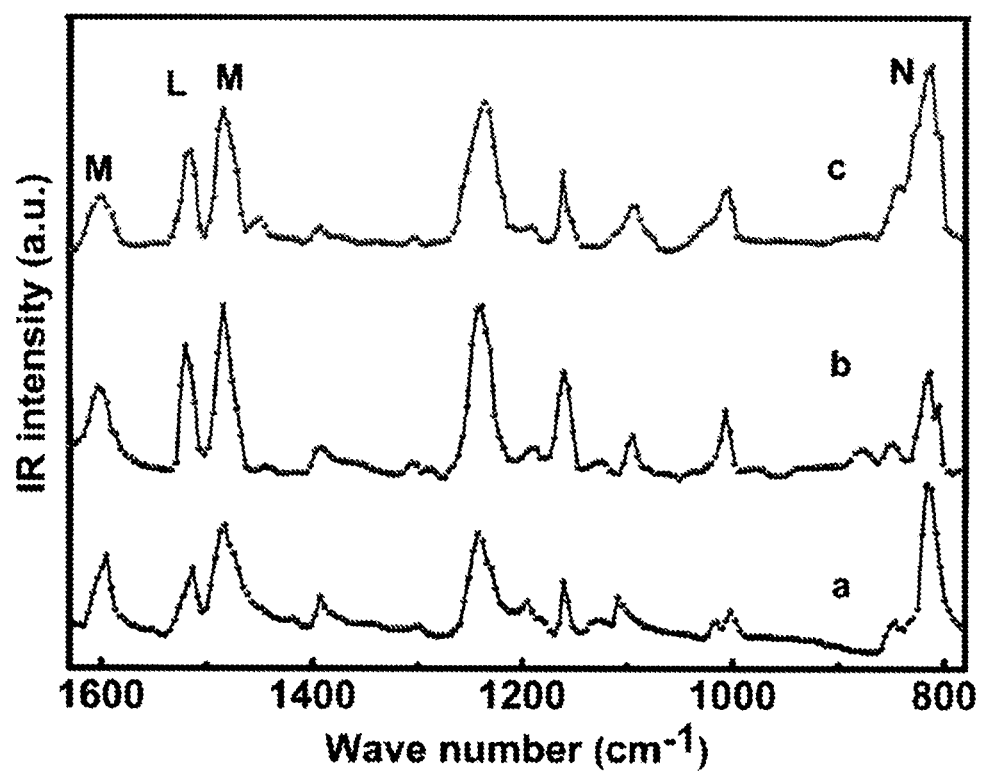
FIG. 3 is a graph showing polarized modulated-infrared reflection absorption spectroscopy (PM-IRRAS) spectra of FBPS in a KBr pellet.

Since it is very difficult to work with oxide-free copper at atmospheric pressure, the work was performed in a reproducible manner on spontaneously oxidized copper substrates. The oxidation was controlled by RCA cleaning at different ratios (v/v/v) of NH$_3$:H$_2$O$_2$:H$_2$O. In FIG. 3, spectra b and c represent PM-IRRAS of FBPS monolayers grafted on an RCA-treated copper substrate at 1/1/16000 and 1/1/4000, respectively. Clearly, the ratios of the polarized bands at 1600 and 1,484 cm$^{-1}$(L), 1,516 cm$^{-1}$(M), and 813 cm$^{-1}$ (N) are different in the SAMs and in the dispersed molecules (KBr pellet). In particular, it can be seen that the M and N polarized bands are smaller in the SAMs. The orientation angles of the molecules were estimated according to Equation 2 (Table 1): α=31°±3 and β=39°±3.

TABLE 1

| FBPS/substrate | $v_{C=C}$(cm$^{-1}$) (M) | $\gamma_{C-Hop}$(cm$^{-1}$) (N) | orientation angles | |
|---|---|---|---|---|
| | | | α ± 3° | β ± 5° |
| FBPS/Au* | 1605 | 818 | 32 | 38 |
| FBPS/Cu RCA 1/1/4000 | 1604 1593 (sh.) | 816 | 35 | 48 |
| FBPS/Cu RCA 1/1/16000 | 1604 1593 (sh.) | 813 | 31 | 39 |
| FBPSH in KBr | 1601 (sh.) 1595 | 813 | | |

RCA cleaning performed on the copper substrate may provide a clean but rough copper oxide layer to reduce the apparent orientation and organization toward the surface of the metal. It is necessary to find a compromise between the cleanliness of the substrate and obtaining relevant values of orientation angles. The best compromise may be obtained when the molecular orientation is closest to normal, i.e., when the RCA condition is around 1/1/16000. From Table 1, it can be seen that the FBPS molecules appear to be less well oriented (tilt angle α=35°) toward the surface normal on the Cu electrode treated with highly concentrated RCA cleaning (NH$_3$:H$_2$O$_2$:H$_2$O=1:1:4000). The orientation of FBPS molecules on the RCA-treated Cu surface is the best (α=310) at a ratio of 1:1:16000. At a lower concentration (1:1:32000), the tilt angle increases because the concentration of an oxidizing solution is not sufficient to remove contamination, which can prevent the molecules from being organized and oriented on the surface. For reference, it can be recalled that an average tilt angle of randomly arranged molecules is 54.7°.

Figure 4:
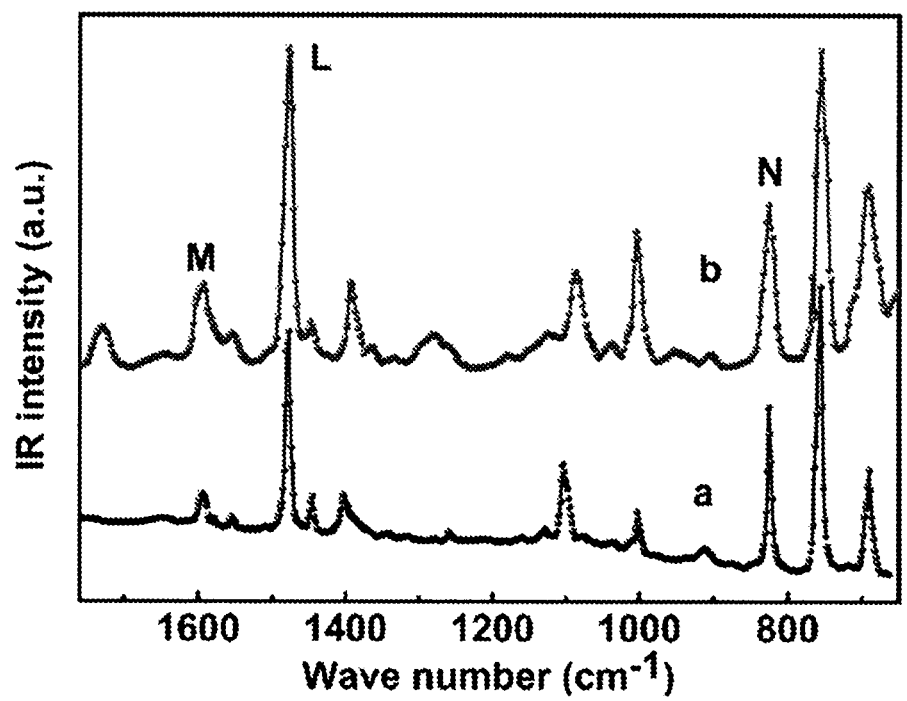
FIG. 4 is a graph showing PM-IRRAS spectra of BPS monolayers adsorbed on an RCA(1/1/16000)-treated Cu substrate.

In order to compare the orientations of FBPS and BPS on copper electrodes, PM-IRRAS spectra (see FIG. 4) of BPS monolayers adsorbed on RCA-treated Cu (NH$_3$:H$_2$O$_2$:H$_2$O=1:1:16000) surface and IR spectra of molecules in a KBr pellet were further recorded. The twist angle β and tilt angle α of BPS molecules absorbed on the RCA-treated Cu surface (Table 2) were calculated by Equation 2. Here, it should be noted that the absorbed BPS molecules are less well oriented (α=47°) on the RCA-treated Cu surface than FBPS molecules.

TABLE 2

Wavelength (cm$^{-1}$) of characteristic vibrations and orientation angles of BPS adsorbed on RCA (1/1/16000)-treated Cu, Au and KBr pellet.

| | $v_{C-C}$(cm$^{-1}$) (M) | ring$_{vC-C}$ + $\delta_{C-H}$ (M) | $v_{C-C}$(cm$^{-1}$) (L) | $\gamma_{C-Hop}$ (cm$^{-1}$) (N) | orientation angles | |
|---|---|---|---|---|---|---|
| | | | | | α ± 3° | β ± 5° |
| BPE/Cu RCA 1/1/16000 | 1600 1583 | 1475 | 1086 | 825 | 47 | 33 |
| BPS/Au | 1605 | 1473 | 1105 | 822 | 34 | 35 |
| BPSH in KBr | 1595 | 1479 | 1103.5 | 826 | | |

On an Au substrate, a difference in organization between BPS and FBPS SAMs is less (see Table 3) and both molecules are oriented. The position of some vibrations is highly dependent on the nature and state of each atom's bonding to sulfur, i.e., H, Au, or Cu/CuO.

TABLE 3

Effect of solvent water on wavelengths (of some characteristic vibrations and on the orientation angles of FBPS adsorbed on RCA-treated Cu.

| Water amount in FBPS/CH$_2$Cl$_2$ | $v_{C-C}$(cm$^{-1}$) (M) | $\gamma_{C-Hop}$(cm$^{-1}$) (N) | orientation angles | |
|---|---|---|---|---|
| | | | α ± 3° | β ± 5° |
| Low (SD solvent) | 1604.7 | 816 | 28 | 38 |
| Intermediate (as distilled) | 1604 1593 (sh.) | 813 | 31 | 39 |
| Added water 0.05M | 1604 (sh.) 1593 | 808 | 39 | 55 |

Figure 9:
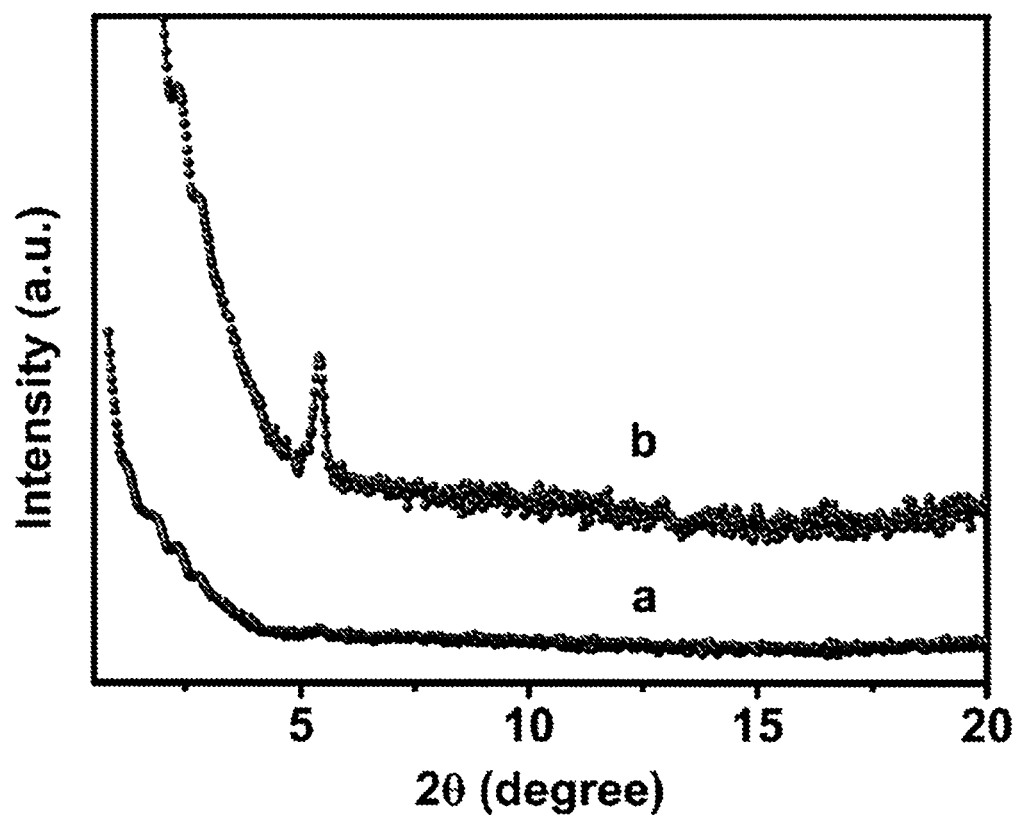
FIG. 9 is a graph showing out-of-plane X-ray diffraction (XRD) spectra of DNTT films formed on BPS- and FBPS-treated Cu substrates.

Under these conditions, the oxide thicknesses for FBPS and BPS were estimated by incident X-ray experiments using the interference effect of the copper oxide layer (see FIG. 9). Similar values of the thicknesses were obtained regardless of the nature of thiols or copper oxide: $d_{ox}$=9±1 nm (1/1/16000 RCA cleaning).

Effect of Water in Thiol Solution

Figure 5:
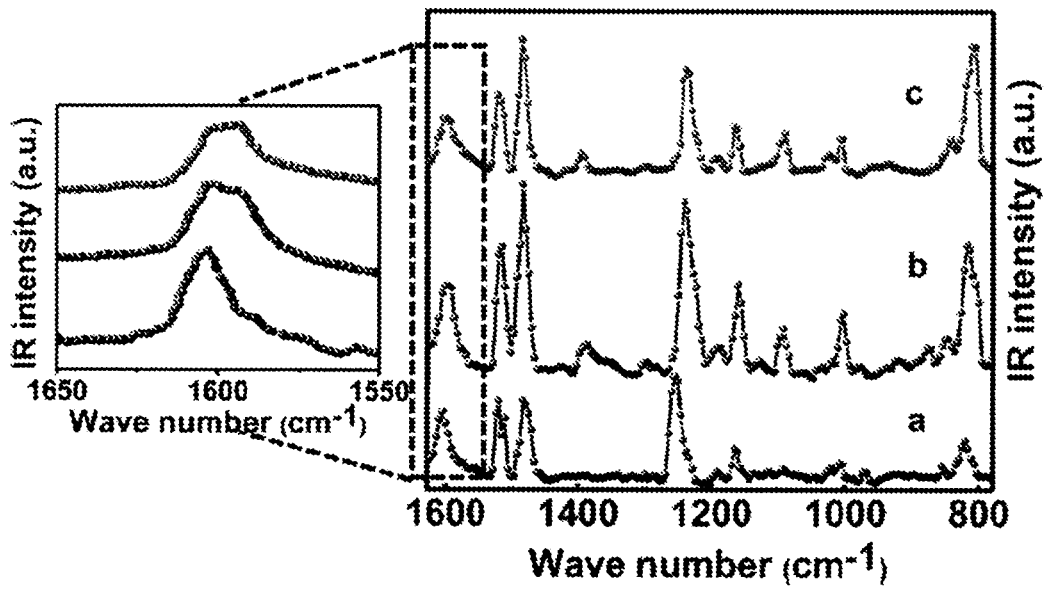
FIG. 5 is a graph showing PM-IRRAS spectra of FBPS monolayers according to concentrations of water in $CH_2Cl_2$.

A copper substrate oxidized by RCA cleaning has an orange-gold-brown color. When immersed in a thiol FBPS solution, the color of the copper substrate changes or not depending on water present in dichloromethane. In a very dry (SD) solvent or freshly distilled CH$_2$Cl$_2$, the color changes to pinkish pearl. Nevertheless, the color does not change even when a small amount of water is added to the solvent. In the case of BPS, the color did not change in freshly distilled CH$_2$Cl$_2$. The changes in the IR spectra and XPS spectra according to the amount of water were recorded. FIG. 5 shows PM-IRRAS spectra of FBPS monolayers as an amount of water increases from (a) to (c).

First, a tilt angle decreases when a solvent is carefully dried and increases when water is added (see Table 3). This means that the smaller the amount of water in a thiol solution, the better FBPS SAM organization. Secondly, some bands shift with an increase in the amount of water, such as increasing a γ(C—H)$_{OP}$ band from 816 cm$^{-1}$ to 808 cm$^{-1}$ (see Table 3). A v(C=C) band around 1,600 cm$^{-1}$ is particularly interesting because as the amount of water increases, a new band appears at 1,592 cm$^{-1}$ as a shoulder of the band at 1,604 cm$^{-1}$ and become even larger than the latter (see Table 3). On Au, this band is positioned at 1,605 cm$^{-1}$ and at 1,601 cm$^{-1}$ in a KBr pellet (Table 3).

This confirms a relationship between a wave number of the band and the nature of the interfacial bond. In addition, it suggests that the nature of the bond between sulfur and copper oxide is different in Au, Cu/BPS, and Cu/FBPS. The nature of copper oxide and its interaction with thiols were analyzed by XPS.

Interaction Between FBPS and BPS Thiols and Copper Oxide

Figure 6:
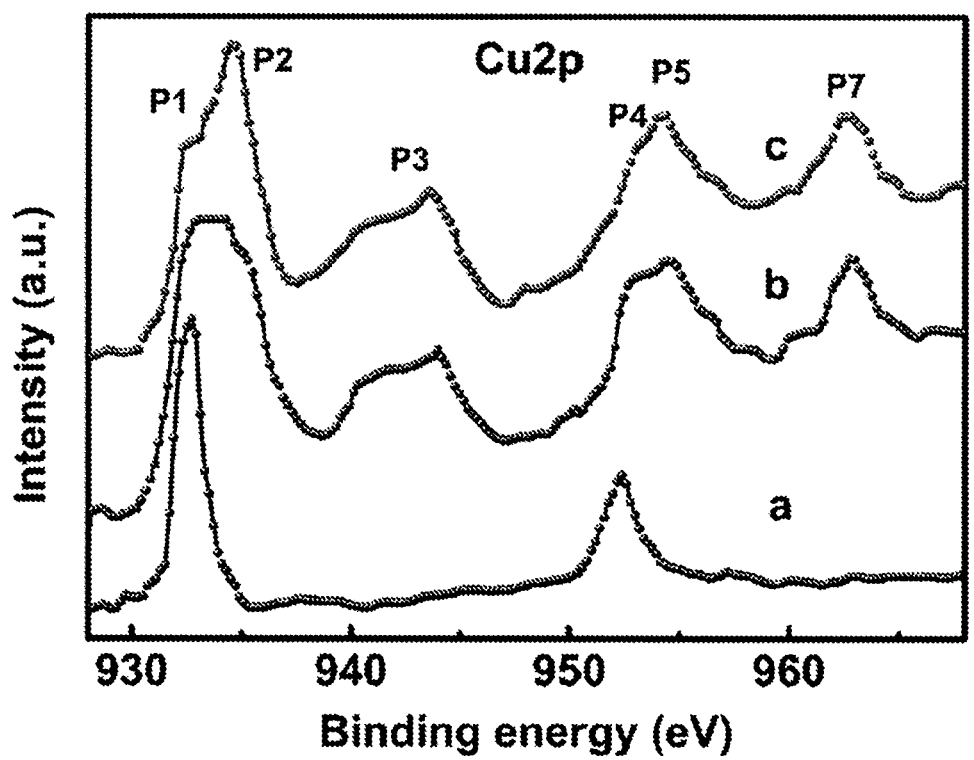
FIG. 6 is a graph showing X-ray photoelectron spectroscopy (XPS) $Cu_2p$ spectra according to Cu treatment conditions.
Figure 7:
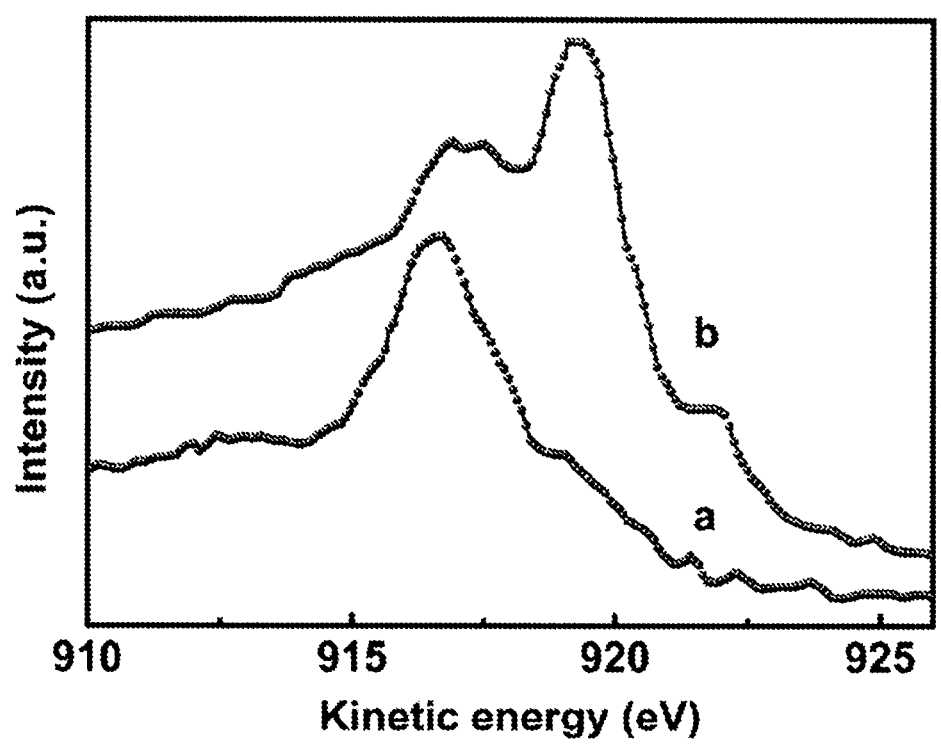
FIG. 7 is a graph showing Cu L3M4, 5 M4, and 5 spectra according to Cu treatment conditions.

In order to understand the different behaviors of BPS and FBPS and the effect of water in a solvent, XPS spectra of different SAMs on Cu were further examined. In FIG. 6 the RCA-treated XPS Cu$_2$p spectrum was compared to spectra of FBPS and BPS SAMs adsorbed on RCA-treated Cu. The XPS spectra of an RCA (1:1:16000)-treated Cu surface have distinctive features at binding energies P1 932.9 eV, P2 934.7 eV, P3 940.6-944 eV, P4 952.4 eV, P5 954.4 eV, and P6 962.6 eV. They are assigned to cuprous oxide (Cu$_2$O) and/or Cu (P1), cupric oxide (CuO), and hydroxide (Cu(OH)$_2$ (P2 and P3), Cu$_2$O (P4), and CuO (P5 and P6)). Since a metal is not significantly observed on an LMM spectrum of the same sample at around 919.1 eV, the possibility that P1 and P4 peaks could be attributed to metal Cu is excluded (see spectrum a in FIG. 7). For comparison, spectrum b (see FIG. 7) which was measured after a Cu substrate was rinsed and an oxide layer was dissolved with citric acid shows the presence of Cu(0). Thereafter, when the Cu substrate is RCA-treated, the outermost oxide layer masks the Cu(0). It is necessary to recall that the depth of analysis is greater in the LMM spectra positioned at higher kinetic energies. Therefore, the RCA-treated Cu surface contains both cupric (CuO) and cuprous (Cu$_2$O) oxides. When the FBPS SAM is grafted on the RCA-Cu surface, peaks P2, P3, P5 and P6 disappear. This implies that all the CuO phases of the RCA-Cu surface have been reduced to Cu$_2$O during the grafting of the FBPS SAM. BPS does not significantly reduce the CuO phases to Cu$_2$O, and the RCA-treated Cu surface may contain a mixture of CuO and Cu(OH)$_2$ phases and possibly a little Cu$_2$O may be present therein.

Figure 8A:
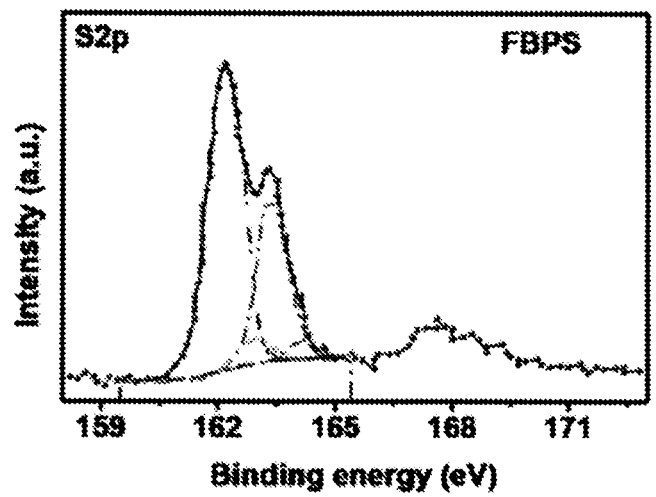
FIGS. 8(a)-8(c) is a set of graphs showing the S2p XPS spectra of FBPS adsorbed on RCA-treated Cu.
Figure 8B:
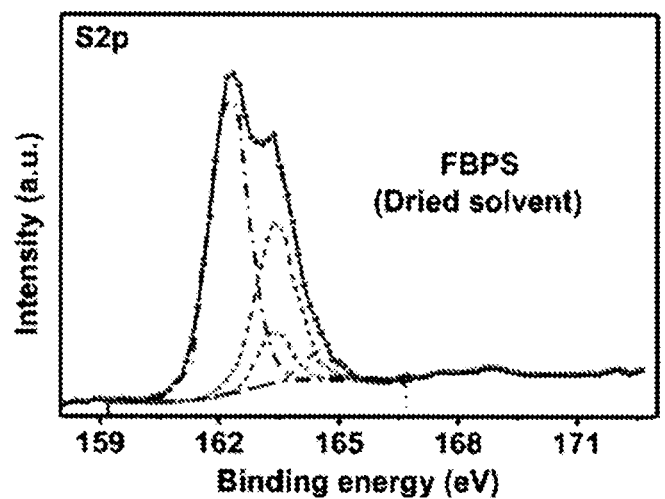

The XPS S2p spectra of the Cu surface were further analyzed. In FIGS. 8(a) and 8(b), under the same conditions as FIG. 5, the influence of the amount of water in the CH$_2$Cl$_2$ is shown in the S2p spectra of FBPS/RCACu.

S2p sulfur doublets (2p3/2, 2p1/2) are observed at 162.2 and 163.4 eV with an intensity ratio of 2. Upon addition of water, another broad peak at 167 eV increases strongly and its intensity for total sulfur increases from 6% to 22%. This peak is a characteristic of oxidized sulfur such as sulfinic (—SO$_2$H) or sulfonic species (—SO$_3$H), which is observed at about 167.7 eV (see the following Chemical Formula 1).

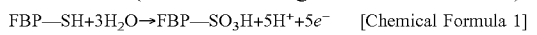

FBP—SH+3H$_2$O→FBP—SO$_3$H+5H$^+$+5e$^-$     [Chemical Formula 1]

Figure 8C:
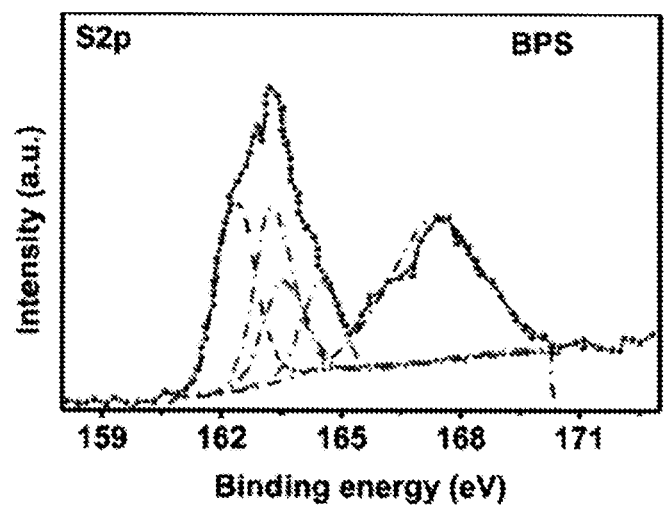

In the case of the BPS grafted on the RCA-treated Cu substrate (see FIG. 8(c)), an amount of sulfur oxides (—SO$_2$H, —SO$_3$H) is larger (39%) with a very broad peak at about 167 eV. Clearly, the presence of water promotes, strongly for BPS and just weakly for FBPS, the extensive oxidation of sulfur to SO$_x$ species (S(III) and S(V)). These species remain in a state of being bonded to the copper surface and may prevent bulk reduction of Cu (II).

In the absence of water, oxidation of the —SH moiety will provide only disulfide that is partially desorbable in a solution and allow reduction to continue. Careful examination of the decomposition of the S2p peak around 163 eV reveals a second doublet that is only important with the BPS (163.25 eV$^{-1}$ to 64.42 eV: ratio 1.9 and 30% of the total sulfur). This value indicates the presence of disulfide BP—S—S—BP attached to the oxidized copper.

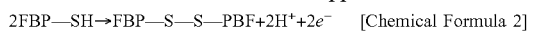

2FBP—SH→FBP—S—S—PBF+2H$^+$+2e$^-$     [Chemical Formula 2]

In the case of FBPS (see FIGS. 8(a) and 8(b)), few disulfide molecules remain anchored on the surface with a S2p doublet (163.2±0.1 eV to 164.3±0.1 eV, ratio 1.8±0.1), which represents 6 to 12% of the total sulfur.

In conclusion, FPBS reduces CuO to $Cu_2O$ with limited oxidation of sulfur to disulfide. Depending on the presence of the fluorine atom in the aromatic ring, it can be expected to stabilize the initial reagent more than the FBPS-radical produced by oxidation, thereby mitigating the reducing power.

BPS molecules may be extensively oxidized to $SO_x$ species to remain on the surface thereby preventing the kinetic bulk reduction of CuO. Such contaminants present on the oxidized Cu surface are a main cause of disorganization of the BPS molecules. In the same way, the presence of water increases the reducing strength of FBPS and tends to produce attached $SO_x$ species.

Structure of DNTT Film on SAM-Modified Copper Substrates

The main objective of the present invention is to make a Cu metal suitable as an electrode material for a diode by appropriate surface treatment. Therefore, DNTT, which is an organic semiconductor (OSC), was additionally deposited on both BPS and FBPS grafted on an RCA-treated Cu substrate and out-of-plane X-ray diffraction (XRD) profiles were recorded. A DNTT layer deposited on a BPS SAM grafted onto RCA-oxidized Cu is amorphous, whereas the out-of-plane XRD profile of the DNTT layer formed on FBPS SAM/$Cu_2O$ shows a distinct peak around 2θ=5.39° associated with a (001) plane of the DNTT layer (see FIG. 9). This confirms the formation of a crystallized DNTT layer on the SAM. The estimated interlayer spacing in the (001) plane is 1.64 nm.

Figure 10A:
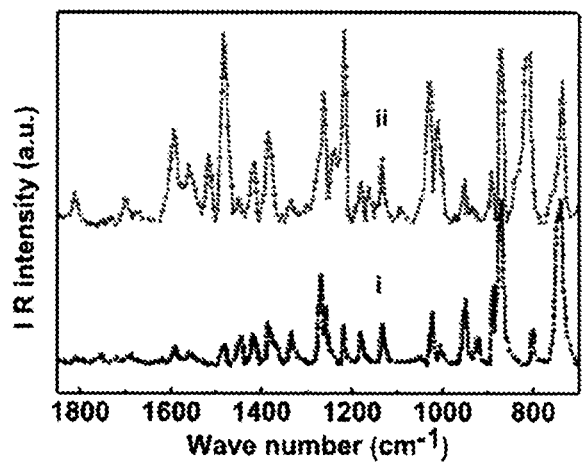
FIGS. 10(a) and 10(b) is a set of graphs showing a PM-IRRAS spectrum of a DNTT layer formed on FBPS-grafted oxidized Cu and an IR spectrum of DNTT in a KBr pellet, and a PM-IRRAS spectrum of DNTT layer formed on BPS-grafted oxidized Cu and an IR spectrum of DNTT in a KBr pellet.
Figure 10B:
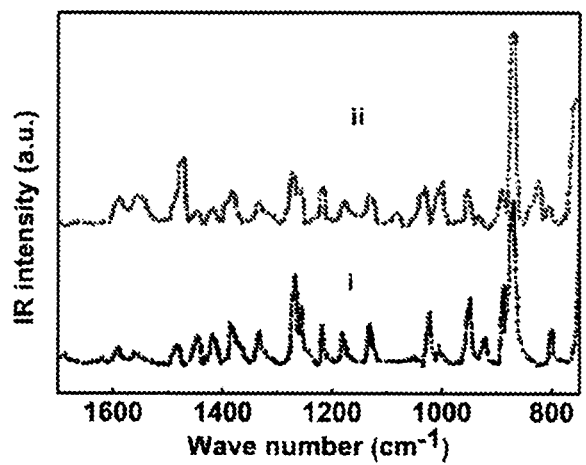

PM-IRRAS spectra of a DNTT layer formed on two SAMs grafted onto RCA-treated Cu (see FIGS. 10(a) and 10(b)) and a spectrum of an SC in a KBr pellet were additionally recorded. The values of the twist and tilt angles of DNTT molecules on the SAMS are shown in Table 4.

TABLE 4

|  | DNTT/FBPS/Au | DNTT/BPS/Au | DNTT/FBPS/Cu RCA(1/1/16000) | DNTT/BPS/Cu RCA(1/1/16000) |
|---|---|---|---|---|
| α'(°)±3 | 21 | 18 | 24 | 50 |
| β'(°)±3 | 40 | 43 | 44 | 51 |
| μ (cm². v⁻¹ s⁻¹) | 1.8 | — | 0.35 | — |

It can be seen that the DNTT molecules are poorly oriented (tilt angle α'=50°) on the BPS SAM grafted on oxidized Cu, whereas the DNTT molecules deposited on the FBPS/$Cu_2O$ are well oriented (α'=24°) toward the surface normal.

Thus, the organization of the DNTT layer mirrors that of the SAM molecules. As the surface on which the DNTT grows is well assembled, the deposited film is crystallized. It can be seen that the crystallization and molecular orientation of the DNTT film on the Au substrate are very similar to those of BPS and FBPS SAMs (see Table 4). Unlike the copper substrate, both the BPS and FPS SAMs are well oriented and induce organization of the SC.

Electrical Properties of Diodes with SAM-Treated Copper Substrates

Figure 11:
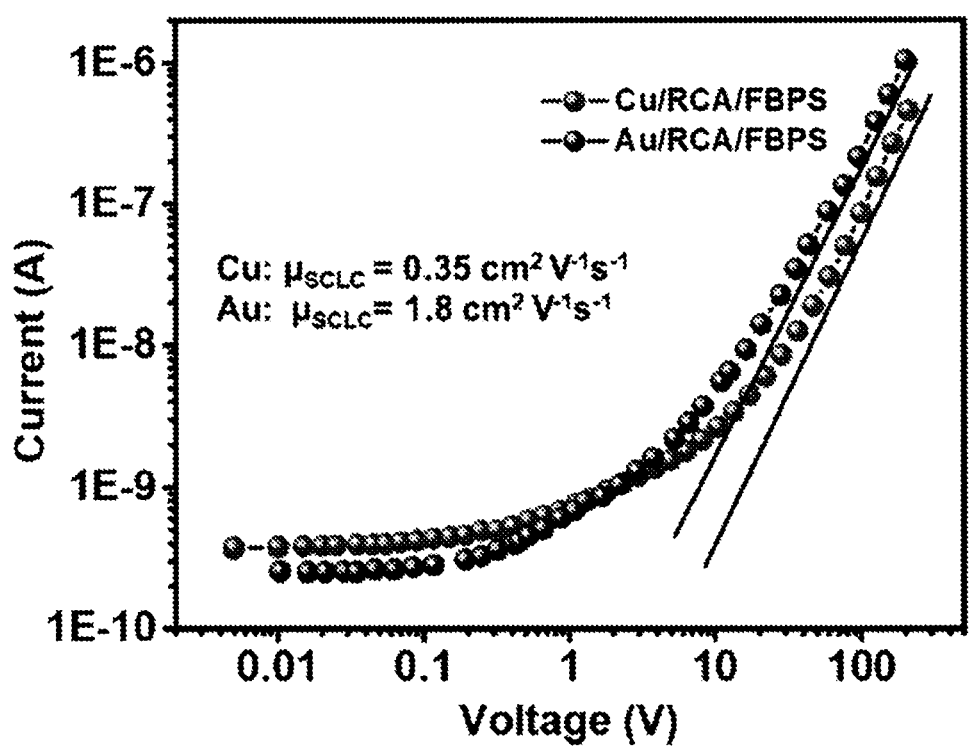
FIG. 11 is a graph showing characteristic current (I)-voltage (V) curves of FBPS/DNTT-based diodes for both Cu and Au electrodes.

FIG. 11 shows characteristic current (I)-voltage (V) curves of diodes formed by DNTT/Cu with FBPS SAMs grafted onto RCA-oxidized Cu and Au used as electrodes. The diode formed with the oxidized Cu electrode and the BPS SAM grafted on the oxidized Cu electrode does not function properly. Therefore, current (I)-voltage (V) curves for these two diode structures could not be shown. The I-V curve follows space-charge-limited current (SCLC) behavior. A slope of the curve is about 1 in a log-log plot at low voltages and converges to a slope of almost exactly 2 at gradually increasing voltage (threshold voltage, $V_{th}$=24.72 V). A variation in current (I) according to an applied voltage for this type of diode structure will be described according to Equation 3 below. This is because the present inventors are dealing with a coplanar geometry in which a film of thickness h is much lower than a channel length L.

$$\frac{I}{W} = \frac{2}{\pi} \varepsilon \mu \frac{V^2}{L^2} \qquad \text{[Equation 3]}$$

Here, W denotes a channel width, p denotes a bulk effective mobility of the SC, and E denotes a dielectric constant of the SC.

By analyzing the (1)=f(V) curve of the diode according to Equation 3, the bulk mobility (in space charge region) of DNTT deposited on the FBPS SAM grafted on the oxidized Cu electrode was estimated. The value is about 0.35 cm²·V⁻¹·s⁻¹ for a $Cu_2O$ electrode and about 1.8 cm²·V⁻¹·s⁻¹ for an Au electrode. Here, well-organized FBPS molecules of the SAM help to deposit a crystalline DNTT layer. With the support of the results obtained with BPS adsorbed on gold electrodes, it can be concluded that the organizations of both the SAMs and the SC layer are insufficient to observe a good effective mobility of the SC and a dipole formed by highly oriented molecules (e.g., FBPS) between the metal and the SC is required to reduce the hole energy barrier between the electrode and the SC.

Due to these two positive effects, the DNTT SC-based diode with FBPS grafted on an oxidized Cu (by RCA (1/1/16000)) electrode operates properly even when the effective mobility of the DNTT film is less than that for gold. Meanwhile, the DNTT layer deposited on the BPS SAM/CuO/Cu is amorphous, and carriers cannot be injected into the modified copper electrode unlike the Au electrode.

Conclusion

The utility of the SAMs of two different conjugated molecules, BPS and FBPS, grafted onto Cu substrates was tested as possible replacements for gold electrodes in electronic devices. Such a goal was achieved by exhibiting a mobility of 0.35 cm²·V⁻¹·s⁻¹ for FBPS/DNTT.

The conditions are: i) the starting Cu electrode is cleaned/oxidized and covered by a thin CuO layer; ii) CuO is reduced to $Cu_2O$ by FBPS which is oxidized only to disulfide $(FBPS)_2$; iii) limited thiol oxidation results in the formation of dipole SAMs oriented on the $Cu_2O$ substrate and, consequently, iv) hole injection barriers caused by the oriented dipoles are reduced and crystalline oriented DNTT films are present.

For BPS SAMs, the thiols re extensively oxidized so that —$SO_x$ species that limit the organization of the SAM and hinder the organization of the DNTT are generated.

According to the present invention, it is possible to use a copper electrode that exhibits excellent electrical performance and stability by replacing expensive gold.

Exemplary embodiments of the present invention described above have been disclosed for illustrative purposes, and it will be understood by those skilled in the art that various modifications, changes, and additions may be made within the spirit and scope of the present invention, and such modifications, changes, and additions should be considered to fall within the scope of the appended claims.

Those skilled in the art to which the present invention belongs can make various substitutions, modifications, and changes without departing from the technical spirit of the present invention, and thus the present invention is not limited by the above-described embodiments and accompanying drawings.

What is claimed is:

1. An organic planar diode comprising:
a copper electrode; and
a semiconductor layer deposited on an upper surface of the copper electrode,
wherein 4'-fluoro-1,1'-biphenyl-4-thiol (FBPS) is grafted on the upper surface of the copper electrode so that a self-assembled monolayer (SAM) is formed.

2. The organic planar diode of claim 1, wherein the copper electrode is subjected to preliminary oxidation (RCA).

3. The organic planar diode of claim 2, wherein the preliminary oxidation (RCA) is performed using a $NH_3/H_2O_2/H_2O$ solution having a predetermined ratio.

4. The organic planar diode of claim 3, wherein the $NH_3/H_2O_2/H_2O$ solution is a mixed solution having a volume ratio of 1:1:16000.

5. The organic planar diode of claim 1, wherein the semiconductor layer is made of a dinaphtho[2,3-b:2',3'-f]thieno[3,2-b]thiophene (DNTT) material.

* * * * *